United States Patent
Carberry

(10) Patent No.: US 9,911,909 B2
(45) Date of Patent: Mar. 6, 2018

(54) METHOD FOR PRODUCING A THERMOELECTRIC MATERIAL

(71) Applicant: Mossey Creek Technologies Inc., Jefferson City, TN (US)

(72) Inventor: John Carberry, Talbott, TN (US)

(73) Assignee: Mossey Creek Technologies, Inc., Jefferson City, TN (US)

( * ) Notice: Subject to any disclaimer, the term of this patent is extended or adjusted under 35 U.S.C. 154(b) by 167 days.

(21) Appl. No.: 15/068,007

(22) Filed: Mar. 11, 2016

(65) Prior Publication Data

US 2016/0197257 A1 Jul. 7, 2016

Related U.S. Application Data

(62) Division of application No. 14/253,524, filed on Apr. 15, 2014, now abandoned.

(60) Provisional application No. 61/812,095, filed on Apr. 15, 2013.

(51) Int. Cl.
| | |
|---|---|
| H01L 35/14 | (2006.01) |
| H01L 35/22 | (2006.01) |
| H01L 35/34 | (2006.01) |

(52) U.S. Cl.
CPC .............. *H01L 35/22* (2013.01); *H01L 35/34* (2013.01)

(58) Field of Classification Search
CPC ................................ H01L 35/22; H01L 35/34
USPC ........................................................ 136/200
See application file for complete search history.

(56) References Cited

U.S. PATENT DOCUMENTS

| | | | |
|---|---|---|---|
| 4,624,862 | A | 11/1986 | Yang et al. |
| 4,803,183 | A | 2/1989 | Schwetz et al. |
| 4,877,759 | A | 10/1989 | Holt |
| 4,908,173 | A | 3/1990 | Schwetz et al. |
| 5,049,367 | A | 9/1991 | Nakano et al. |
| 5,165,983 | A | 11/1992 | Sugiura et al. |
| 5,427,601 | A | 6/1995 | Harada et al. |
| 5,431,869 | A | 7/1995 | Kumar et al. |
| 5,654,246 | A | 8/1997 | Newkirk et al. |
| 6,013,236 | A | 1/2000 | Takahashi et al. |
| 6,902,699 | B2 | 6/2005 | Fritzemeier et al. |
| 7,344,675 | B2 | 3/2008 | Van Daam et al. |
| 7,354,490 | B2 | 4/2008 | Fritzmeier et al. |
| 7,604,696 | B2 | 10/2009 | Carberry |
| 7,922,841 | B2 | 4/2011 | Bampion |
| 2002/0125402 | A1 | 9/2002 | Cordes et al. |
| 2004/0048411 | A1 | 3/2004 | Nishida |

(Continued)

FOREIGN PATENT DOCUMENTS

| | | |
|---|---|---|
| CN | 101244823 | 8/2008 |
| JP | 11-54805 | 2/1999 |

(Continued)

*Primary Examiner* — Jayne Mershon
(74) *Attorney, Agent, or Firm* — Pitts & Lake, P.C.

(57) ABSTRACT

A method for fabricating a thermoelectric material comprising providing an initial feedstock of silicon metal particulates, providing an extracting liquid to extract oxidants from the silicon metal particulates, combining the silicon metal particulates and the extracting liquid into a mixture and milling said mixture, withdrawing at least a portion of the milled mixture, within the withdrawn portion of the milled mixture, separating milled silicon metal particulates from the extracting liquid, and mixing the milled silicon metal particulates with a dopant to form a thermoelectric material.

13 Claims, 1 Drawing Sheet

(56) References Cited

U.S. PATENT DOCUMENTS

| | | |
|---|---|---|
| 2004/0261830 A1 | 12/2004 | Sharp |
| 2005/0145176 A1 | 7/2005 | Wicker |
| 2006/0142143 A1 | 6/2006 | Abrevaya et al. |
| 2008/0153688 A1 | 6/2008 | Borers et al. |
| 2008/0202575 A1* | 8/2008 | Ren .................. H01L 35/16 136/201 |
| 2008/0233720 A1 | 9/2008 | Carberry |
| 2009/0120493 A1 | 5/2009 | Sinha |
| 2009/0191112 A1 | 7/2009 | Moon et al. |
| 2009/0250103 A1 | 10/2009 | Katoh et al. |
| 2010/0059107 A1 | 3/2010 | Barnett et al. |
| 2010/0084776 A1 | 4/2010 | Murozono et al. |
| 2010/0108115 A1* | 5/2010 | Lee .................. H01L 35/16 136/236.1 |

FOREIGN PATENT DOCUMENTS

| | | |
|---|---|---|
| WO | WO 2004055909 | 7/2004 |
| WO | WO 2006107769 | 10/2006 |
| WO | WO 2010/092972 | 8/2010 |
| WO | WO 2012/033303 | 3/2012 |
| WO | WO 2012/067327 | 5/2012 |

* cited by examiner

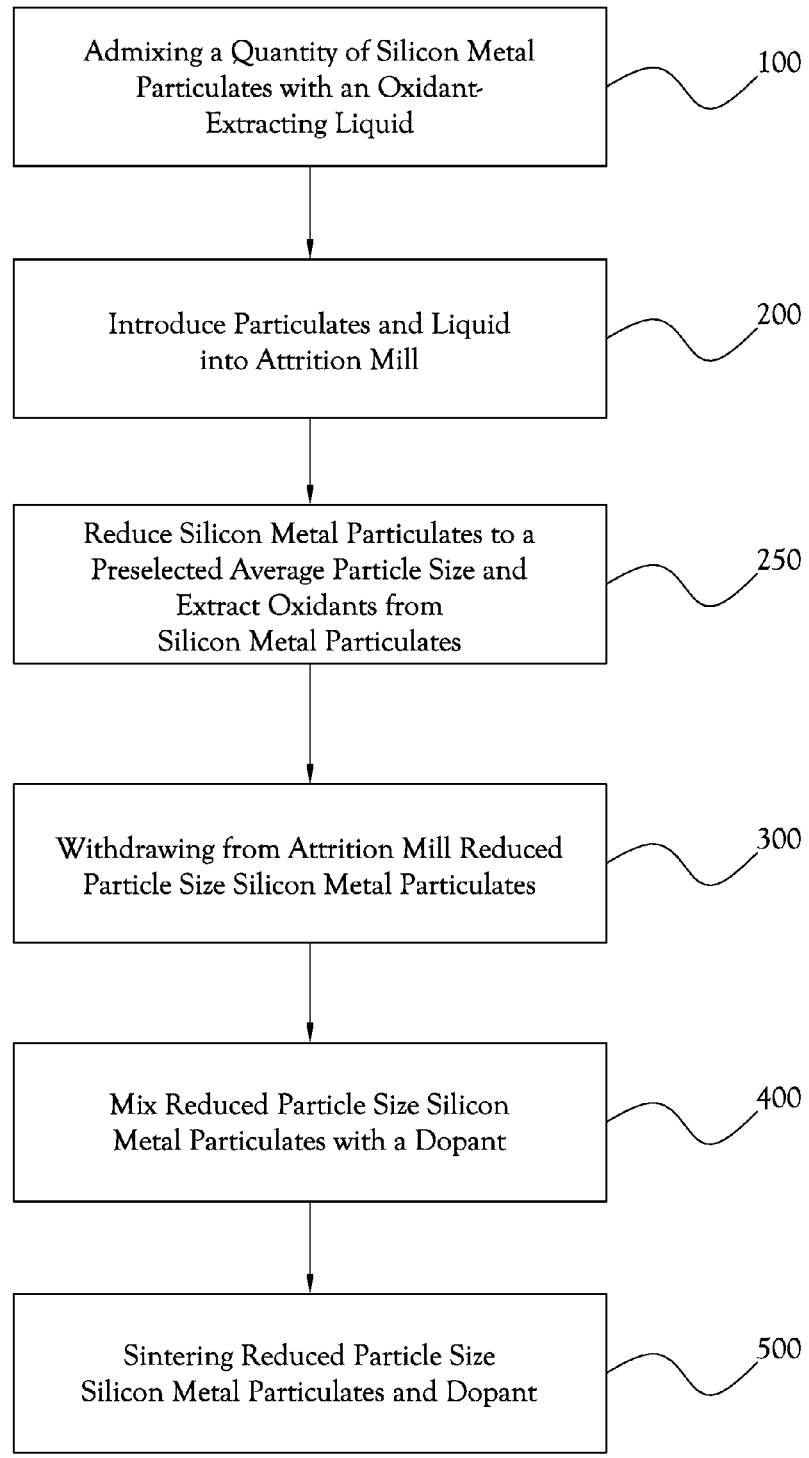

METHOD FOR PRODUCING A THERMOELECTRIC MATERIAL

CROSS-REFERENCE TO RELATED APPLICATIONS

This Application is a divisional patent application of U.S. patent application Ser. No. 14/253,524, filed Apr. 16, 2014, which claims the benefit of and priority to U.S. Provisional Patent Application Ser. No. 61/812,095, filed Apr. 15, 2013, the contents each of which are herein incorporated in their entireties by reference.

STATEMENT REGARDING FEDERALLY SPONSORED RESEARCH OR DEVELOPMENT

Not Applicable

BACKGROUND OF THE INVENTION

1. Field of Invention

The present general inventive concept relates to the preparation and use of silicon-based materials with thermoelectric properties.

2. Description of the Related Art

The biggest sources of waste heat include electrical generators, steel and glass production, the use of combustible fuels for transportation, oil refineries, as well as the loss and cost of disposal of heat in terms of fans and heat sinks for electronic semiconductors and power devices, air conditioning, and other low temperature applications. The electrical efficiency of power plants for instance, the ratio between energy used in the process and the energy extracted is about 30%.

Physics offers a path for recovery of most all waste heat, from low temperature to high temperature, by exploiting the use of semiconductive materials exhibiting the Seebeck effect where electrons are both carriers of electricity and heat. This class of material is called thermoelectrics. Both n-type and p-type thermoelectrics must be used in tandem to produce power from waste heat or to (reversibly) use power to instead cool or heat through solid-state means (i.e., no moving parts except electrons). When a uniaxial temperature gradient is present within a TE structure, a colder and a warmer, a diffusion of electrons is created from the hot side toward the cold side, forming two poles of an electrical field. The voltage measured therein called Seebeck voltage. The Seebeck coefficient (S) has units of voltage per unit temperature and is a material property.

There exists a need to find a material for use as a thermoelectric semiconductor capable of being molded or fabricated into shapes to exploit a unidirectional thermal gradient for the production of electrical power.

Most contemporary thermoelectric materials and their compounds suffer from a variety of ills, including high cost, difficulty in processing, poor performance, use of precious or potentially carcinogenic elements, limited freedom of the engineer to manipulate properties such as electrical resistivity and thermal conductivity, thermal shock susceptibility, shape, size, indexing these properties from the hot side to the cold side and many others. For this reason, progress has been slow and unaccretive with regard to ZT and operating temperature and size for a very long time. None of those in the current road map use my approach of nano silicon porous structures, though all advances as cited above use nanostructuring to realize the benefits of the quantum size effects on thermal conductivity.

Materials such as bismuth telluride ($Bi_2Te_3$) and bismuth selenide ($Bi_2Se_3$) comprise some of the best performing low-temperature temperature thermoelectrics with a temperature-independent ZT between 0.8 and 1.0. These materials are used for solid-state cooling in small consumer refrigerators and for solid-state heating in some styles of mosquito traps. Nanostructuring these materials to produce a layered superlattice structure of alternating $Bi_2Te_3$ and $Bi_2Se_3$ layers produces a device within which there is good electrical conductivity but perpendicular to which thermal conductivity is poor. The result is an enhanced ZT (approximately 2.4 at room temperature for p-type), but this high value has not been independently substantiated. However, the availability of elements such as tellurium and selenium may soon be in jeopardy as reports indicate both are past their production peaks. Therefore it is desirable to identify thermoelectric materials having long-term abundance (e.g., silicon).

Skutterudite thermoelectrics are of contemporary interest because of their medium to high-temperature use capability. These structures are of the form $(Co,Ni,Fe)(P,Sb,As)_3$. Unfilled, these materials contain voids into which low-coordination ions (usually rare earth elements) can be inserted to alter thermal conductivity by producing sources for lattice phonon scattering and decrease thermal conductivity due to the lattice without reducing electrical conductivity. However, the processing of making dense skutterudite thermoelectrics is not trivial. It involves powder preparation methods and billet formation methods that are not particularly well-suited for mass production or net shape processing. $Al_2O_3$ while being inexpensive and a low dielectric, has a high CTE and a low thermal conductivity.

BeO has a high thermal conductivity, low dielectric, but is toxic and expensive and has a high CTE.

AlN has a low dielectric, and high thermal conductivity and a low CTE, but is expensive.

Glass, including fused silica, is inexpensive, has a low dielectric, a low CTE and a very low thermal conductivity.

To date, silicon has not been widely used, possibly because of the danger of milling silicon to sizes in the micron to submicron range. While many of the factors for silicon have been proven, for instance ability to engineer low thermal conductivity, dope to increase electrical conductivity, relative insensitivity of silicon's Seebeck Coefficient to doping and electrical conductivity, high operating temperature, the approaches taken so far are mostly expensive, size limiting and process limiting approaches such as nano wires and MEMS.

BRIEF SUMMARY OF THE INVENTION

The present invention, in some of its several embodiments, comprises thermoelectric materials and methods and processes for making the same. In some embodiments, the thermoelectric materials include silicon milled according to a process taught by U.S. Pat. No. 6,638,491.

Some example embodiments of the present invention comprise an alloy of silicon milled with some other material (or "dopant"), wherein the dopant is added to the melt during a late or final step of the silicon refinement process. In many cases, the dopant added to the melt and alloyed with the silicon is selected so as to optimize the desired electrical properties (e.g., n-type or p-type semiconductor). In particular, for n-type semiconductors, arsenic is attractive and useful dopant due to the large size of the lattice with arsenic (compared to, e.g., phosphorous) and the comparatively low mobility through thermal diffusion.

The silicon and dopant are milled and formed into the desired shape or shapes. These "green" production preforms can include established processes including tape casting, iso-pressing, dry pressing, slip casting, injection molding, and the like, which means one can make very inexpensive and yet complex net shapes. Such processes allow for the fabrication of shapes that fully exploit a unidirectional thermal gradient.

In many cases, the formation of planer or complex shapes includes a two-step process in which one side is fabricated with silicon doped with a first dopant so as to be n-type and the other side is fabricated with silicon doped with a second dopant so as to be a p-type semiconductor. This combined with the tailored electrical and thermal conductivity properties allows for the production of a Seebeck device of optimal efficiency and performance.

This thermoelectric material is then "sintered" into a polycrystalline form and shape with controlled porosity and density and high intrinsic mechanical strength. The sintering process is a solid state diffusional process wherein the grains contact each other and bond at a temperature below the melting temperature of the silicon.

Relatively pure bulk silicon preforms have been produced by dry pressing and sintering in argon (or some other inert gas or atmosphere) at a temperature less than the melting point of silicon (approx. 1414° C.). Such processes result in thermoelectric structures with controlled electrical resistivity and dramatically reduced thermal conductivity compared to competing materials. Pure, single-crystal silicon has thermal conductivity of 149 watts per meter-Kelvin (W/m·K), yet processes according to embodiments of the present general inventive concept have made bulk sintered polycrystalline silicon thermoelectrics (SinPolySiTEs) with controlled electrical resistivity and thermal conductivity down to 10 W/m·K. Further decreases in K are achievable with more careful control of porosity, control of grain size and grain size distribution of the milled silicon powder, and the introduction of an appropriate secondary phase.

In some example embodiments of the present general inventive concept, a process for fabricating a thermoelectric material includes admixing a quantity of silicon metal particulates with a liquid having the ability to limit oxidation of the silicon metal particulates, said step of admixing maintained for a time sufficient for wetting the first quantity of silicon metal particulates in the liquid prior to attrition to develop an oxidant free mixture of particulates and liquid, introducing said oxidant-free mixture of particulates and liquid into an attrition mill, said step of introducing proceeding in the absence of oxidants, subjecting said silicon metal particulates of said mixture to attrition in the attrition mill for a time sufficient to reduce at least a portion of said silicon metal particulates to a preselected average particle size, said liquid limiting oxidation of said silicon metal particulates during this time, to produce a second quantity of reduced particle size silicon metal particulates being essentially oxidant free, withdrawing from said attrition mill at least a portion of said second quantity of reduced particle size silicon metal particulates, along with a portion of said liquid. providing an initial feedstock of silicon metal particulates, mixing the milled silicon metal particulates with a dopant to form a thermoelectric material, and sintering the milled silicon metal particulates and dopant at a temperature below the melting point of silicon.

In some embodiments, the dopant is a material selected in order to make the thermoelectric material an n-type semiconductor.

In some embodiments, the dopant is a material selected in order to make the thermoelectric material a p-type semiconductor.

In some embodiments, the dopant is arsenic.

In some embodiments, the thermoelectric material includes two sides, wherein a first side is an n-type semiconductor and a second side is a p-type semiconductor.

In some embodiments, the preselected average particle size is less than 1,000 nanometers.

In some embodiments, the preselected average particle size is less than 600 nanometers.

In some embodiments, the preselected average particle size is less than 300 nanometers.

In some example embodiments of the present general inventive concept, a method for fabricating a thermoelectric material includes providing an initial feedstock of silicon metal particulates, providing an extracting liquid to extract oxidants from the silicon metal particulates, combining the silicon metal particulates and the extracting liquid into a mixture and milling said mixture, withdrawing at least a portion of the milled mixture, within the withdrawn portion of the milled mixture, separating milled silicon metal particulates from the extracting liquid, and mixing the milled silicon metal particulates with a dopant to form a thermoelectric material.

In some embodiments, the method includes the further step, following mixing the milled silicon metal particulates with a dopant, of sintering the milled silicon metal particulates and dopant at a temperature below the melting point of silicon.

In some embodiments, the dopant is a material selected in order to make the thermoelectric material an n-type semiconductor.

In some embodiments, the dopant is a material selected in order to make the thermoelectric material a p-type semiconductor.

In some embodiments, the dopant is arsenic.

In some embodiments, the thermoelectric material includes two sides, wherein a first side is an n-type semiconductor and a second side is a p-type semiconductor.

In some example embodiments of the present general inventive concept, a thermoelectric material to exploit a unidirectional thermal gradient for the production of electrical power includes a body fabricated from milled silicon alloyed with a dopant and sintered at a temperature below the melting point of silicon.

In some embodiments, the dopant is a material selected in order to make the thermoelectric material an n-type semiconductor.

In some embodiments, the dopant is a material selected in order to make the thermoelectric material a p-type semiconductor.

In some embodiments, the body includes two sides, a first side being an n-type semiconductor and a second side being a p-type semiconductor.

In some embodiments, the milled silicon includes particles with an average particle size is less than 1,000 nanometers.

In some embodiments, the milled silicon includes particles with an the average particle size is less than 600 nanometers.

In some embodiments, the milled silicon includes particles with an the average particle size is less than 300 nanometers.

BRIEF DESCRIPTION OF THE SEVERAL VIEWS OF THE DRAWINGS

The above-mentioned features and other aspects of the invention will become more clearly understood from the following detailed description of the invention read together with the drawings in which:

FIG. 1 is a flow diagram of an example embodiment of a process for fabricating a thermoelectric material.

DETAILED DESCRIPTION OF THE INVENTION

Disclosed herein are silicon-based thermoelectric materials and methods for making the same. In some embodiments, the thermoelectric materials include silicon milled according to a process taught by U.S. Pat. No. 6,638,491.

Some example embodiments of the present invention comprise an alloy of silicon milled with some other material (or "dopant"), wherein the dopant is added to the melt during a late or final step of the silicon refinement process. In many cases, the dopant added to the melt and alloyed with the silicon is selected so as to optimize the desired electrical properties (e.g., n-type or p-type semiconductor). In particular, for n-type semiconductors, arsenic is attractive and useful dopant due to the large size of the lattice with arsenic (compared to, e.g., phosphorous) and the comparatively low mobility through thermal diffusion.

The silicon and dopant are milled and formed into the desired shape or shapes. These "green" production preforms can include established processes including tape casting, iso-pressing, dry pressing, slip casting, injection molding, and the like, which means one can make very inexpensive and yet complex net shapes. Such processes allow for the fabrication of shapes that fully exploit a unidirectional thermal gradient.

In many cases, the formation of planer or complex shapes includes a two step process in which one side is fabricated with silicon doped with a first dopant so as to be n-type and the other side is fabricated with silicon doped with a second dopant so as to be a p-type semiconductor. This combined with the tailored electrical and thermal conductivity properties allows for the production of a Seebeck device of optimal efficiency and performance.

This thermoelectric material is then "sintered" into a polycrystalline form and shape with controlled porosity and density and high intrinsic mechanical strength. The sintering process is a solid state diffusional process wherein the grains contact each other and bond at a temperature below the melting temperature of the silicon. The sintering process, generally carried out in a vacuum or ear vacuum, and at a temperature below the melting point of the silicon, does not significantly increase the density of the thermoelectric material (which would increase the thermal conductivity of the thermoelectric material).

Relatively pure bulk silicon preforms have been produced by dry pressing and sintering in argon (or some other inert gas or atmosphere) at a temperature less than the melting point of silicon (approx. 1414° C.). Such processes result in thermoelectric structures with controlled electrical resistivity and dramatically reduced thermal conductivity compared to competing materials. Pure, single-crystal silicon has thermal conductivity of 149 watts per meter-Kelvin (W/m·K), yet processes according to embodiments of the present general inventive concept have made bulk sintered polycrystalline silicon thermoelectrics (SinPolySiTEs) with controlled electrical resistivity and thermal conductivity down to 10 W/m·K. Further decreases in K are achievable with more careful control of porosity, control of grain size and grain size distribution of the milled silicon powder, and the introduction of an appropriate secondary phase.

The use of an inert atmosphere for the sintering process (in many example embodiments an argon atmosphere) is useful for preventing oxidation of the milled silicon and for preventing other undesirable side effects. It has been found that very low levels of oxygen will oxidize the surfaces of small pieces of silicon. Also, atmospheric carbon monoxide will both oxidize the surface of the silicon and form silicon carbide. This can form a "skin" which will retain its shape to very high temperatures and could preclude the formation of these many bonds particle to particle where the electrical conductivity is maintained very high and oxides or silicon carbide do not form and limit this sintering or interfere with electrical conductivity.

Given the design of the tools and the materials of construction very common to these furnaces and tools, often or nearly always including carbon or graphite, there are normally several sources of oxygen, being carbon monoxide or carbon dioxide, silicon monoxide or dioxide, oxygen and the like. In the case of the silicon stealing oxygen from the extant carbon oxide gas, this is doubly lethal to our process as it will form both silicon oxide and silicon carbide on the surface of the particles. One must control the oxygen and partial pressure of oxygen and constituents such as carbon monoxide to very low levels, such low levels that the surface area of silicon and graphite and carbon presents many times more atoms than is present in the atmosphere.

The level of oxygen available to react with the silicon must be reduced, in the preferred embodiment to significantly less than $10^{17}$ molecules of oxygen per liter, preferably $10^{14}$ molecules per liter or less, or to put it another way, the number of atoms of silicon and graphite in the system should vastly outnumber the number of atoms of oxygen. A vacuum has been shown to work in some embodiments of the present general inventive concept. In cases using a vacuum, a 0.2 micron vacuum reduces the molecules of oxygen in a liter of space by 99.999978%, which means the oxygen in a liter of space is reduced from $3.18 \times 10^{21}$ to $8.36 \times 10^{14}$. At the same time, in a typical environment the number of atoms of silicon and graphite available for reaction might be $10^{21}$ or much more, meaning that very little of the silicon is oxidized to make SiO or reacted with carbon to make SiC.

In one embodiment, the sintering atmosphere is created by using a vacuum furnace, first purged with argon, then at a low temperature before oxygen can react with carbon, evacuated to form a vacuum to a typical level of pressure equal to 0.2 microns of mercury. In such a case the oxygen level is in the range of $8.36 \times 10^{14}$ and the oxygen level is so low it precludes the formation of the oxide of silicon or the carbide of silicon in the areas where the silicon particles are to be bonded together.

In some example embodiments of the present general inventive concept, the porosity of the structures thus made is reticulated, meaning that a wide variety of materials can be "infiltrated" or filled into the body of the silicon forms (or between the silicon grains) to further modify and control thermal conductivity, electrical conductivity, and Seebeck coefficient (parameters that, in concert, dictate the TE effect). This allows for two means of control of the TE effect via (1) the polycrystalline Si grains themselves and (2) any introduced the secondary, grain boundary phase. Impregnation can also be used to give the preform strength for very precise machining operations where billets can, for instance, be preformed by iso-pressing, and then complex shapes can be machined by industrial machining operations.

To decrease thermal conductivity of the thermoelectric material while not interfering with the electrical function, the reticulated spaces and surfaces are coated or filled with a glass coating through the use of colloidal silica or ethyl silicate as a precursor. The benefits of this include giving the silicon protection from oxidation and decreasing the thermal conductivity of the structure, the glass having a theoretical thermal conductivity of about 1.4 W/m·K.

Some example embodiments of processes and methods according to the present general inventive concept start with raw materials doped at high levels of purity and precision to provide n-type and p-type semiconductor performance with very low electrical resistivity, in the range of 0.002 ohms/cm$^2$ or lower, providing electrical conductivity in the range of tens of thousands of Siemens/meter. Silicon and dopants are milled in ethanol using the Carberry '462 patent, reducing the silicon to a particle size less than one micron, preferably in the range of a few hundred nanometers, while keeping the silicon pure and free of oxidation. The resulting porous pellets or other forms of milled silicon and dopants thus fabricated are then pressed and sintered in a furnace where the availability of oxygen and contributors of oxygen are kept at exceptionally low levels, perhaps by a vacuum in the range of 0.2 microns of mercury pressure, perhaps in an atmosphere of argon or other inert gas.

Dopants minimize the electrical resistivity in both n-type and p-type semiconductors, conversely maximizing electrical conductivity and thereby optimizing the ZT function in the formula where the nominator is the Seebeck coefficient squared times the electrical conductivity divided by the thermal conductivity, all of this factored by the absolute temperature. In some embodiment, the dopant is selected to deliver an electrical resistivity of no more than 2 m-ohms. The above-discussed doping may occur, for example, either by providing an initial feedstock comprising high-purity silicon and an appropriate dopant, or by adding dopant to silicon during the milling process. In certain embodiments, the dopant may be selected from the group consisting of arsenic, phosphorous, boron, and gallium. However, other suitable dopants may be used without departing from the spirit and scope of the present general inventive concept.

In some example embodiments of the present general inventive concept, silicon is milled according to a method disclosed in U.S. Pat. No. 6,638,491, issued to Carberry. In such a case the use of this technology is helpful in that it provides for a safe cost effective way to mill silicon.

Turning to FIG. 1, in some example embodiments of the present general inventive concept, a process for fabricating a thermoelectric material includes a number of steps. A quantity of silicon metal particulates are admixed 100 with a liquid having the ability to limit oxidation of the silicon metal particulates, said step of admixing maintained for a time sufficient for wetting the first quantity of silicon metal particulates in the liquid prior to attrition to develop an oxidant free mixture of particulates and liquid. The oxidant-free mixture of particulates and liquid is introduced 200 into an attrition mill, said step of introducing proceeding in the absence of oxidants, subjecting said silicon metal particulates of said mixture to attrition in the attrition mill 250 for a time sufficient to reduce at least a portion of said silicon metal particulates to a preselected average particle size, said liquid limiting oxidation of said silicon metal particulates during this time, producing a second quantity of reduced particle size silicon metal particulates being essentially oxidant free. At least a portion of said second quantity of reduced particle size silicon metal particulates, along with a portion of said liquid, is withdrawn 300 from said attrition mill. The milled silicon metal particulates are mixed (or allyed) with a dopant 400 to form a thermoelectric material. Then, the milled silicon metal particulates and dopant are sintered 500 at a temperature below the melting point of silicon.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

What is claimed is:

1. A process for fabricating a thermoelectric material, comprising:
   admixing a quantity of silicon metal particulates with a liquid having the ability to limit oxidation of the silicon metal particulates, said step of admixing maintained for a time sufficient for wetting the first quantity of silicon metal particulates in the liquid prior to attrition to develop an oxidant free mixture of particulates and liquid;
   introducing said oxidant-free mixture of particulates and liquid into an attrition mill, said step of introducing proceeding in the absence of oxidants;
   subjecting said silicon metal particulates of said mixture to attrition in the attrition mill for a time sufficient to reduce at least a portion of said silicon metal particulates to a preselected average particle size, said liquid limiting oxidation of said silicon metal particulates during said time, to produce a second quantity of reduced particle size silicon metal particulates being essentially oxidant free;
   withdrawing from said attrition mill at least a portion of said second quantity of reduced particle size silicon metal particulates, along with a portion of said liquid,
   mixing the silicon metal particulates with a dopant to form a thermoelectric material; and
   sintering the milled silicon metal particulates and dopant at a temperature below the melting point of silicon.

2. The process of claim 1 wherein the dopant is a material selected in order to make the thermoelectric material an n-type semiconductor.

3. The process of claim 1 wherein the dopant is a material selected in order to make the thermoelectric material a p-type semiconductor.

4. The process of claim 1 wherein the dopant is arsenic.

5. The process of claim 1 wherein the thermoelectric material includes two sides, wherein a first side is an n-type semiconductor and a second side is a p-type semiconductor.

6. The process of claim 1 wherein the preselected average particle size is less than 1,000 nanometers.

7. The process of claim 1 wherein the preselected average particle size is less than 600 nanometers.

8. The process of claim 1 wherein the preselected average particle size is less than 300 nanometers.

9. A method for fabricating a thermoelectric material, comprising:
   providing an initial feedstock of silicon metal particulates;

providing an extracting liquid to extract oxidants from the silicon metal particulates;

combining the silicon metal particulates and the extracting liquid into a mixture and milling said mixture;

withdrawing at least a portion of the milled mixture;

within the withdrawn portion of the milled mixture, separating milled silicon metal particulates from the extracting liquid; and mixing the milled silicon metal particulates with a dopant to form a thermoelectric material.

10. The method of claim 9 further comprising the step, following mixing the milled silicon metal particulates with a dopant, of sintering the milled silicon metal particulates and dopant at a temperature below the melting point of silicon.

11. The method of claim 9 wherein the dopant is a material selected in order to make the thermoelectric material an n-type semiconductor.

12. The method of claim 9 wherein the dopant is a material selected in order to make the thermoelectric material a p-type semiconductor.

13. The method of claim 9 wherein the thermoelectric material includes two sides, wherein a first side is an n-type semiconductor and a second side is a p-type semiconductor.

* * * * *